United States Patent [19]
Kim

[11] Patent Number: 6,031,589
[45] Date of Patent: Feb. 29, 2000

[54] LIQUID CRYSTAL DISPLAY DEVICE AND THE FABRICATION METHOD THEREOF

[75] Inventor: Hong-Gyu Kim, Kyungki-do, Rep. of Korea

[73] Assignee: LG Electronics Inc., Seoul, Rep. of Korea

[21] Appl. No.: 08/872,198

[22] Filed: Jun. 10, 1997

[30] Foreign Application Priority Data

Jun. 11, 1996 [KR] Rep. of Korea ....................... 96-20811

[51] Int. Cl.[7] .............................................. G02F 1/1343
[52] U.S. Cl. ................... 349/39; 349/38; 349/42; 349/43; 257/59; 257/72; 257/213
[58] Field of Search ................................. 349/38, 39, 42, 349/43; 257/59, 72, 213

[56] References Cited

U.S. PATENT DOCUMENTS 5,784,131   7/1998   Kim et al. .................................. 349/39

*Primary Examiner*—Robert H. Kim
*Assistant Examiner*—Andrew H. Lee
*Attorney, Agent, or Firm*—Fleshner & Kim

[57] ABSTRACT

A liquid crystal display device of the present invention has a plurality of gate lines and data lines perpendicularly formed to define the pixel areas. A first semiconductor layer is formed on each pixel area of a substrate and has a source area and a drain area. A second semiconductor layer is formed on each pixel area of the substrate and is used for a storage capacitor electrode. A gate electrode is formed between the source and drain of the first semiconductor layer and contacts each gate line. A common electrode line is formed under each data line to make contact with the second semiconductor layer, and is used for the storage capacitor electrode. A pixel electrode is formed in each pixel area, making contact with the drain area of the first semiconductor layer.

17 Claims, 13 Drawing Sheets

LIQUID CRYSTAL DISPLAY DEVICE AND THE FABRICATION METHOD THEREOF

BACKGROUND OF THE INVENTION

1. Field of the Invention

The present invention relates to a liquid crystal display device and, more particularly, to a structure of a liquid crystal display device and its fabrication method.

2. Background of the Related Art

Generally, a liquid crystal display device includes a lower substrate on which thin film transistor and pixel electrode are arranged, an upper substrate on which a color filter for displaying colors and a common electrode are formed. A liquid crystal is filled between those two substrates, and a polarizing substrate is installed on both sides of those two glass substrates and for pre-polarizing the visible ray (natural ray).

FIG. 1 is a circuit diagram of the thus-structured liquid crystal display (LCD) device. The device includes a thin film transistor (TFT), namely, a switching circuit, a liquid crystal capacitor and a storage capacitor formed by the liquid crystal between the upper/lower substrate electrodes, a gate signal line and a data signal line.

If a voltage signal is applied to the gate line, the TFT turns on while the data voltage signal containing the picture image data is applied to the data signal line. The data voltage of the data signal line passes through the TFT and charges up the storage capacitor and the liquid crystal capacitor, thereby operating the LCD device.

FIG. 2 is a plan view of the lower substrate of the related art LCD device. FIGS. 3A to 3H are sectional views illustrating the fabrication steps of the LCD device taken along lines I—I of FIG. 2.

As illustrated in FIG. 3A, a polycrystalline silicon is deposited on a transparent substrate 1 such as glass or quartz substrate, and patterned to form a semiconductor layer 2 on a predetermined portion of the substrate 1. The semiconductor layer 2 is used for an active area of TFT and an electrode of the storage capacitor.

As illustrated in FIG. 3B, a photoresist layer 3 is coated on the overall surface of the substrate and patterned to expose the semiconductor layer 2, which will be used as the lower electrode of the storage capacitor. Impurity ions, P or B, are implanted into the semiconductor layer 2 using the photoresist layer 3 as a mask.

As illustrated in FIG. 3C, the photoresist layer 3 is eliminated and a gate insulating layer 4 is formed on the overall surface of the substrate 1, including the semiconductor layer 2. A layer made of a material such as B or P doped polycrystalline silicon or silicide is deposited on the overall surface of the substrate 1, including the gate insulating layer 4, and patterned to form a gate line 5a and a common electrode line 5b. The common electrode line 5b serves as the upper electrode of the storage capacitor.

As illustrated in FIG. 3D, impurity ions, P or B, are implanted into the semiconductor layer 2 by using the gate line 5a as a mask, and the semiconductor layer 2 is heat-treated to activate the implanted ions and to form source and drain regions.

As illustrated in FIG. 3E, the first interlayer insulating layer 6, such as silicon oxide, is deposited on the overall surface of the substrate 1. The gate insulating layer 4 and the first interlayer insulating layer 6 are selectively removed to open a source region in the semiconductor layer 2, thereby forming a first contact hole 7.

As illustrated in FIG. 3F, a metallic layer is deposited on the overall surface of the substrate 1 including a first interlayer insulating layer 6. The metallic layer is patterned to form a data line 8 and is connected to the source region of the semiconductor layer 2 through the first contact hole 7.

As illustrated in FIG. 3G, a second interlayer insulating layer 9 is deposited on the overall surface of the substrate 1 including the data line 8. The gate insulating layer 4 and the first and second interlayer insulating layers 6 and 9 are selectively eliminated to expose a drain of the semiconductor layer 2, thereby forming a second contact hole 10.

As illustrated in FIG. 3H, the transparent conductive layer made of a material such as indium tin oxide (ITO) is deposited on the second interlayer insulating layer 9, and patterned to form the pixel electrode 11 which is connected to the drain region of the semiconductor layer 2. A passivation layer 12 is formed on the overall surface of the substrate 1 including the pixel electrode 11 to complete the formation of the lower substrate of the LCD device.

The related art device and its fabrication method have various disadvantages. For example, the sequential deposition of the semiconductor layer, the gate insulating layer and the common electrode line to form the storage capacitor decreases the aperture ratio of the LCD device. The common electrode line is too opaque and the aperture ratio is decreased by the size of the storage capacitor, namely, by 20–30% of the pixel area.

Further, since the gate line is formed by using a polycrystalline silicon including impurity ions, its resistance is too large for application to a LCD device of high image quality. Moreover, the hydrogen ions cannot enter into a channel area through the gate electrode during a hydrogenation process in which hydrogen radicals are fed into the semiconductor layer to enhance the performance of the device by the polycrystalline silicon TFT. Instead, the hydrogen radicals are laterally diffused through the gate insulating layer when the gate line is formed of a silicide material, such as WSix or MoSix. Such a process is time consuming to perform the hydrogen process the performance of the device.

The above references and/or description are incorporated by reference herein where appropriate for appropriate teachings of additional or alternative details, features and/or technical background.

SUMMARY OF THE INVENTION

Accordingly, the present invention is directed to a liquid crystal display device and its fabrication method that substantially obviates one or more of the problems due to limitations and disadvantages of the related art.

An object of the present invention is to provide an LCD device drastically enhancing its interlayer and its fabrication method.

Another object of the invention is to provide an LCD device drastically decreasing a resistance of a gate line and its fabrication method.

To achieve these and other advantages and in accordance with the purpose of the present invention, as embodied and broadly described, the liquid crystal display device of the invention has matrix type pixel areas, a plurality of gate lines and data lines perpendicularly formed between the pixel areas, the device including a substrate, a first semiconductor layer formed on each pixel area of the substrate and having a source area and a drain area, a second semiconductor layer formed on each pixel area of the substrate and doped for a storage capacitor electrode, a gate electrode formed between the source and drain of the first semiconductor layer and making contact with each gate line; a common electrode line formed under each data line to make contact with the second semiconductor layer, and used for the storage capacitor electrode; and a pixel electrode formed in each pixel area, making contact with the drain area of the first semiconductor layer. Another characteristic of the LCD device of the invention is that the common electrode line overlaps with the data lines.

The present invention may be also achieved in part or in whole by a method of fabricating the liquid crystal display device of the invention includes the steps of: preparing a substrate, forming a first semiconductor layer on a thin film transistor area of the substrate, and a second semiconductor layer on a storage capacitor area, forming a gate insulating layer on the overall surface of the substrate including the first and second semiconductor layers, and implanting impurity ions in the second semiconductor layer, forming a gate electrode on the first semiconductor layer, and simultaneously forming a common electrode line on a gate insulating layer to be connected to the second semiconductor layer, implanting the impurity ions in the first semiconductor layer, using the gate electrode as a mask to form a source area and a drain area, forming a pixel electrode in each pixel area to be connected to the drain area of the first semiconductor layer, and forming a first interlayer insulating layer on the overall surface of the substrate including the gate electrode, forming the gate line on the first interlayer insulating layer to be connected to the gate electrode, and forming a second interlayer insulating layer on the overall surface of the substrate including the gate lines, and forming the data line on the second interlayer insulating layer to be connected to the source area of the first semiconductor layer, and forming a passivation layer on the overall surface of the substrate including the data lines.

The present invention can be achieved in whole or in part by a semiconductor device comprising: a substrate; a plurality of first electrode lines; a plurality of second electrode lines and third electrode lines to define at least one pixel area, each pixel area having; a transistor on the pixel area of the substrate, the transistor having a first electrode coupled to a corresponding third electrode line, a second electrode and a control electrode coupled to a corresponding second electrode line, a capacitor, separated from the transistor, formed on the pixel area, the capacitor being coupled to a corresponding first electrode line, and a pixel electrode formed on the pixel area of the substrate, the pixel electrode being coupled to the second electrode of the transistor and overlapping the capacitor.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
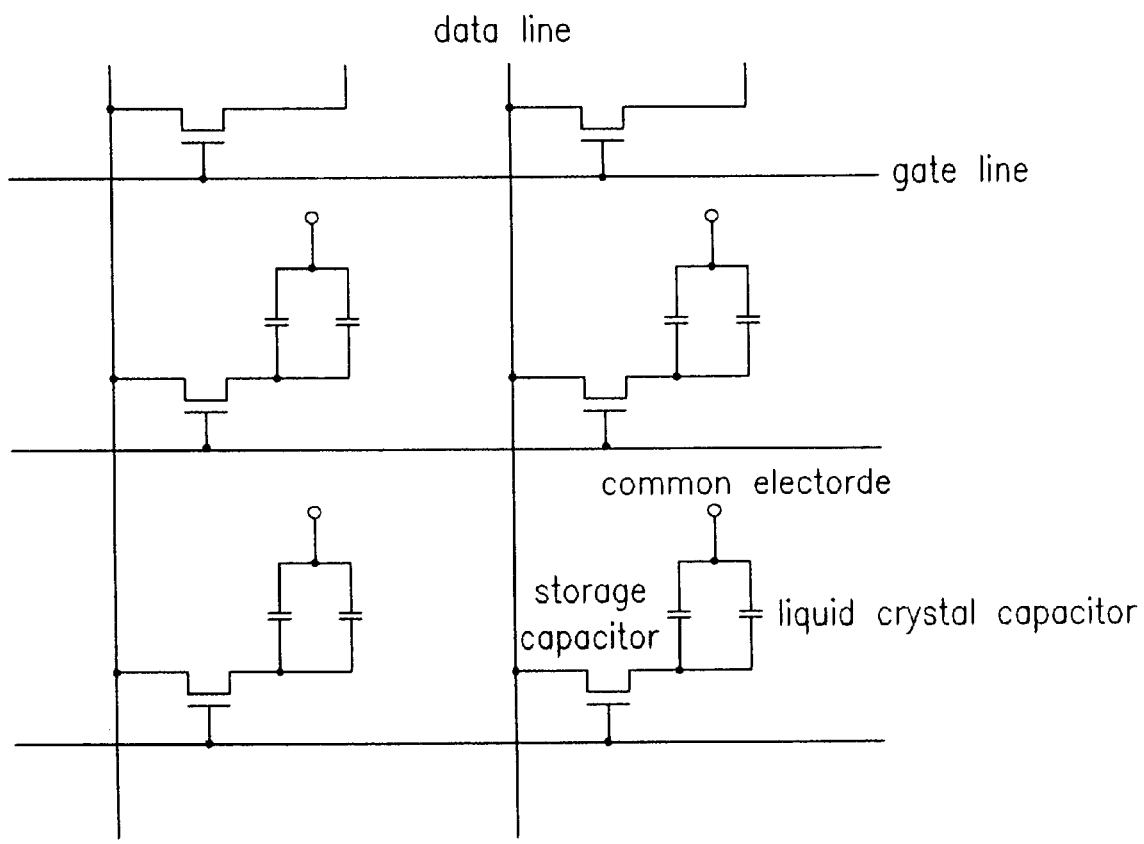
FIG. 1 is a circuit diagram of a related art liquid crystal display device.
Figure 2:
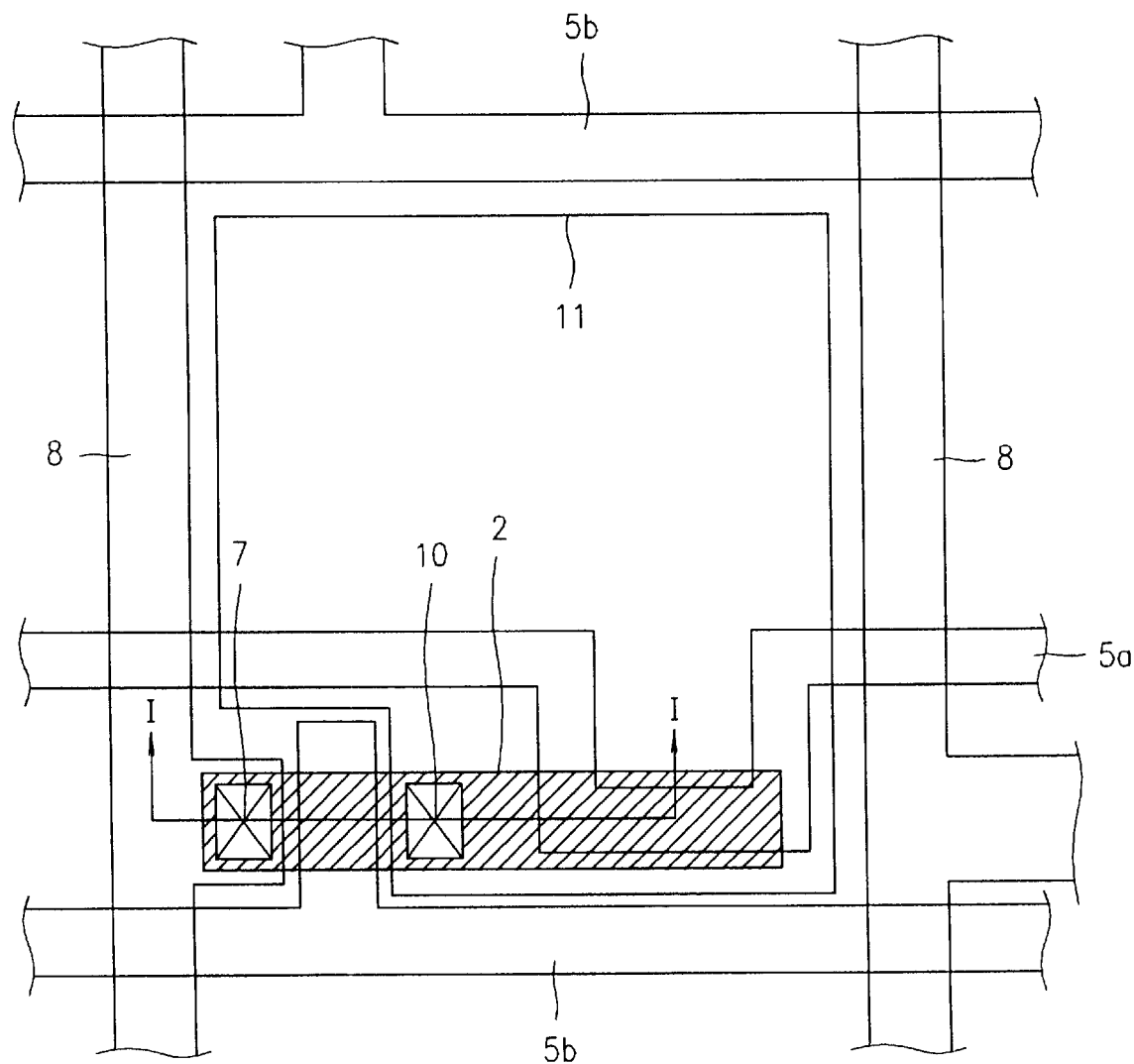
FIG. 2 illustrates a plan view of a related art LCD device.
Figure 3A:
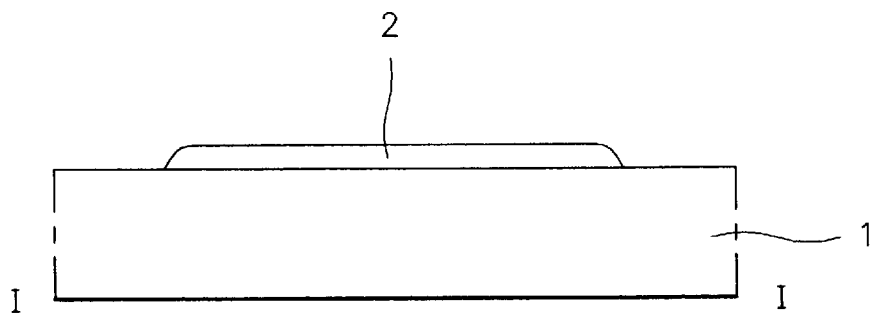
FIGS. 3A to 3H are sectional views illustrating the fabrication steps of the LCD device taken along lines I—I of FIG. 2.
Figure 3B:
Figure 3B:
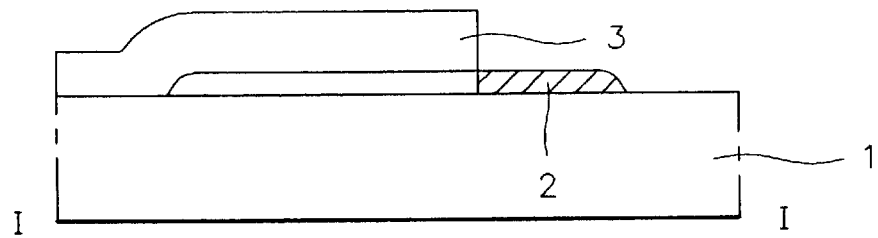
Figure 3C:
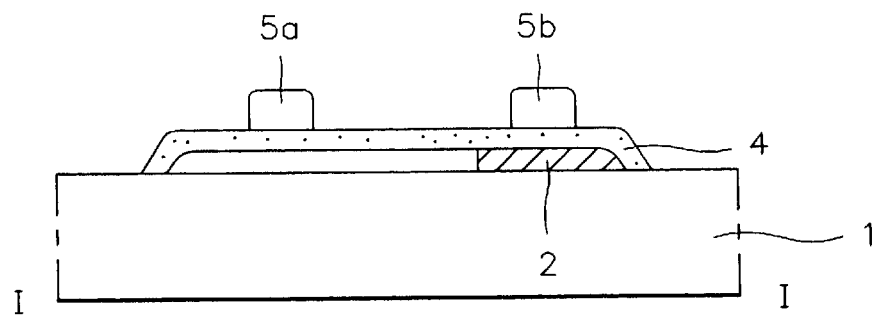
Figure 3D:
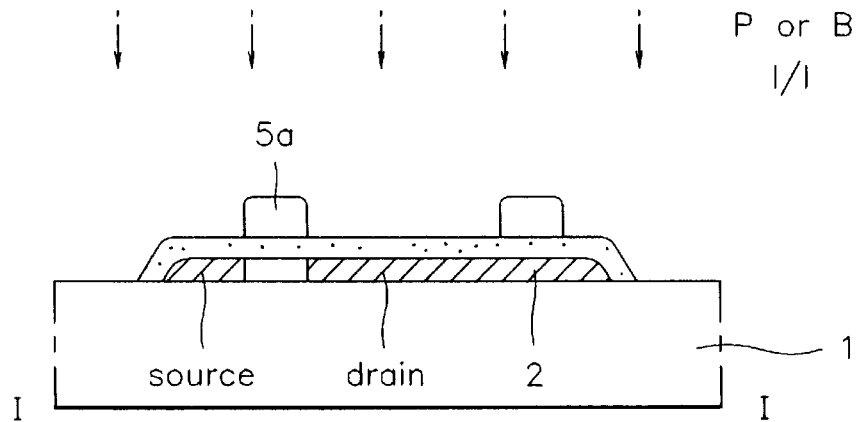
Figure 3E:
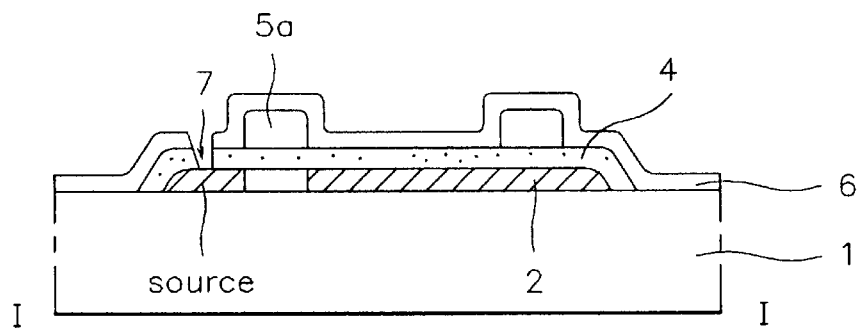
Figure 3F:
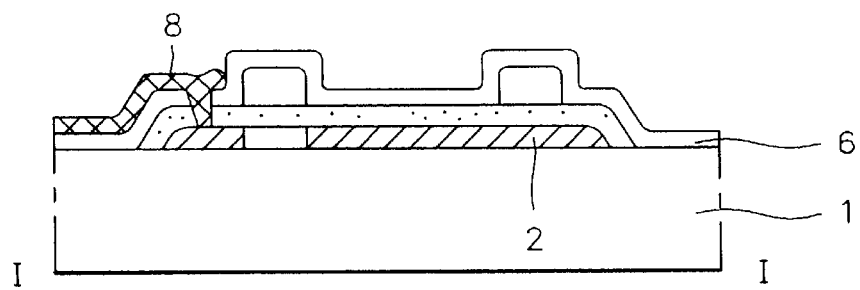
Figure 3G:
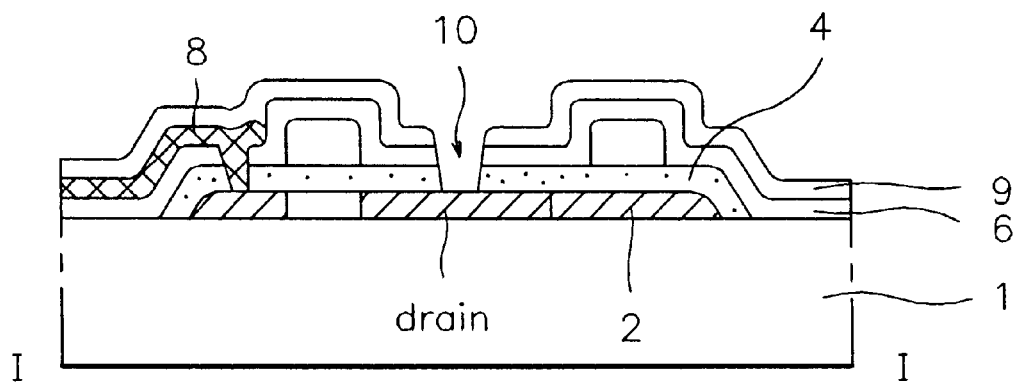
Figure 3H:
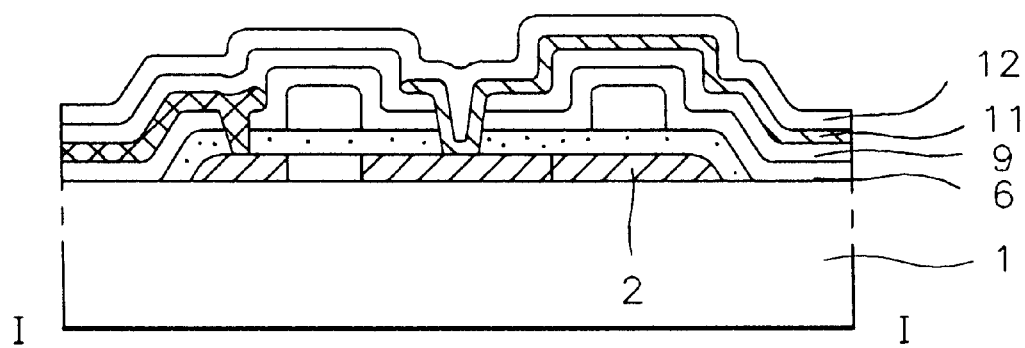
Figure 4:
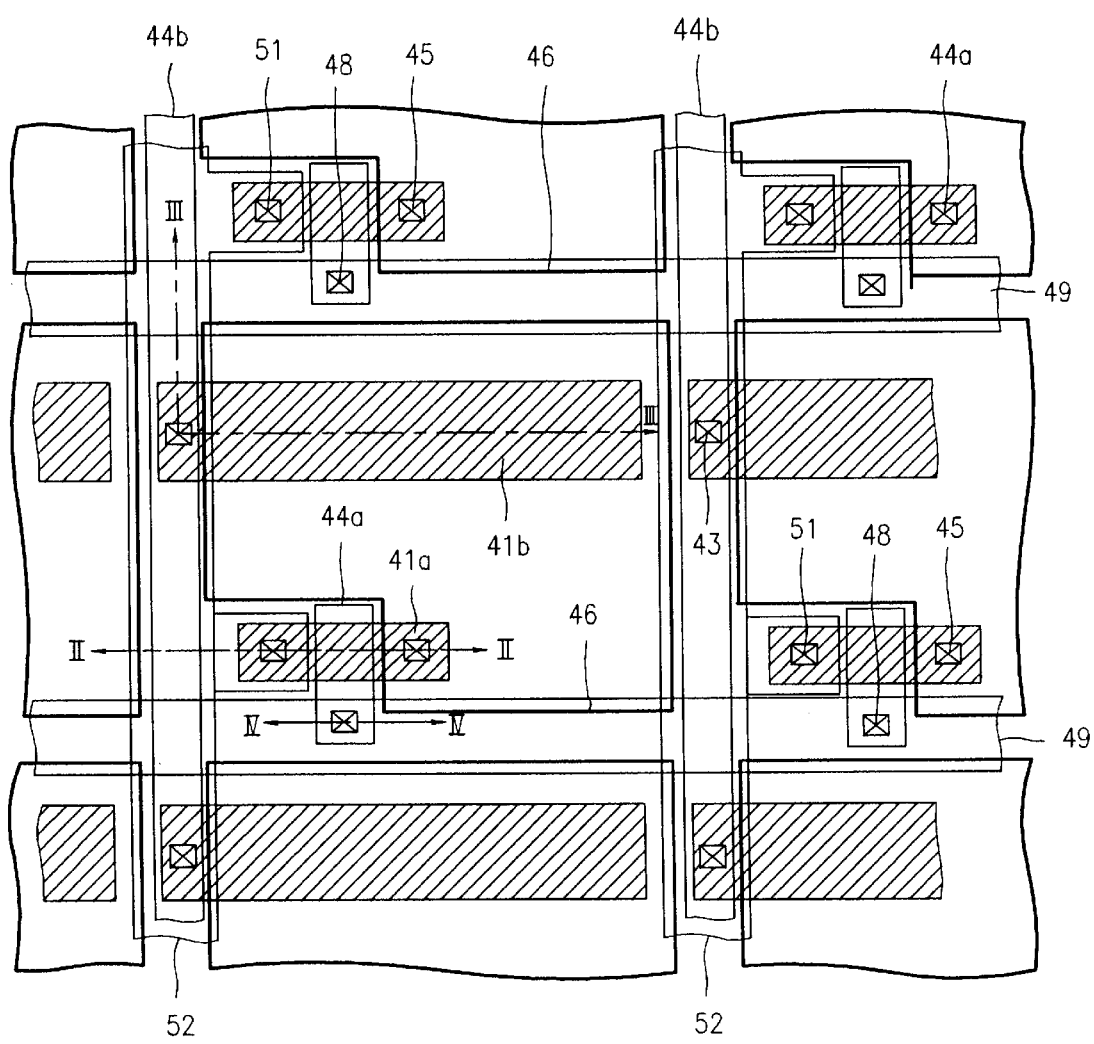
FIG. 4 is a plan view of the LCD device in accordance with a preferred embodiment of the present invention.

As illustrated in FIG. 4, the LCD device of the invention has a plurality of gate lines 49 spaced apart from each other at regular intervals, and a plurality of data lines 52 spaced apart from each other at regular intervals, and preferably perpendicular to the plurality of gate lines 49. A first semiconductor layer 41a having a source and a drain is formed on each pixel area of the substrate having the gate lines 49 and the data lines 52. A second semiconductor layer 41b formed as an island is used as the electrode of the storage capacitor. Gate electrodes 44a, in contact with the gate line 49, are formed between the source and the drain of the first semiconductor layers 41a. Common electrode lines 44b, formed under the data lines 52, contact with the second semiconductor layer 41b. The common electrode lines 44b overlap with the data lines 52 and are formed of the same material as the gate electrodes 44a.

Figure 5A:
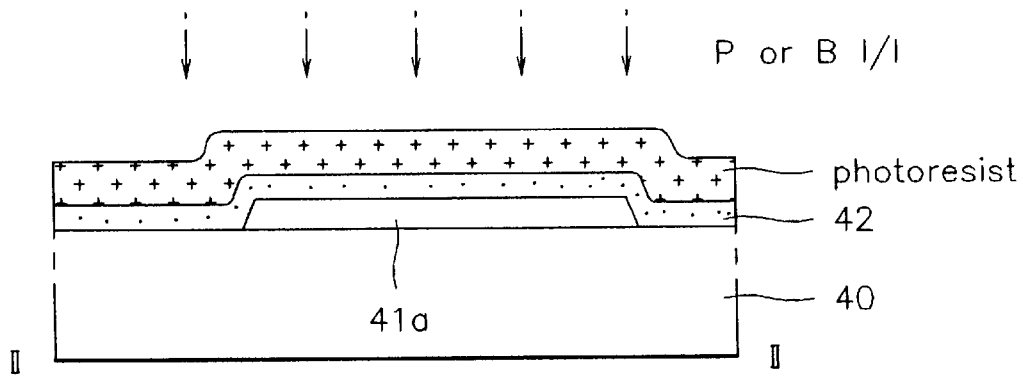
FIGS. 5A to 5H are sectional views illustrating the fabrication steps of the LCD device taken along lines II—II of FIG. 4.
Figure 6A:
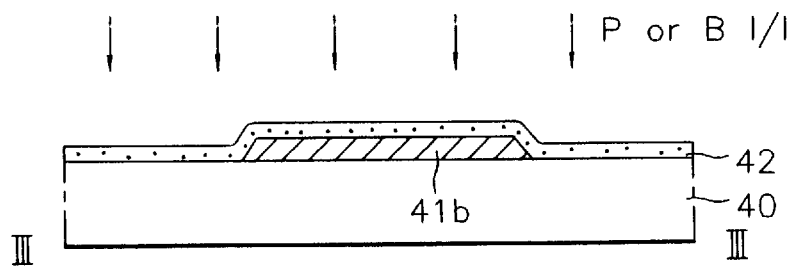
FIGS. 6A to 6H are sectional views illustrating the fabrication steps of the LCD device taken along lines III—III of FIG. 4.
Figure 7A:
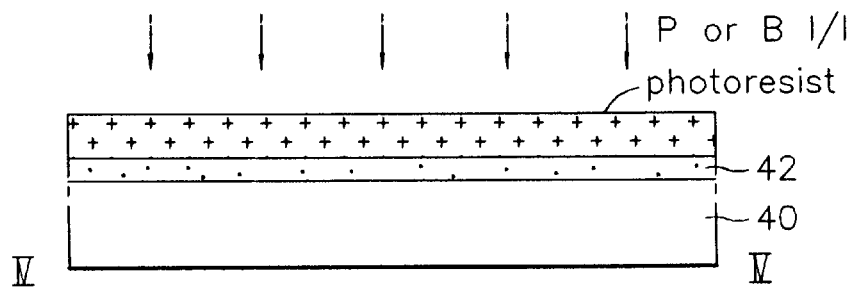
FIGS. 7A to 7H are sectional views illustrating the fabrication steps of the LCD device taken along lines IV—IV of FIG. 4.

With reference to FIGS. 5A, 6A and 7A, a plurality of polycrystalline silicon is formed on the transparent insulating substrate 40 such as glass or quartz, and patterned to form the first and second semiconductor layers 41a and 41b. The first semiconductor layer 41a is used for an active area of TFT, and the second semiconductor layer 41b is used for the electrode of the storage capacitor. The gate insulating layer 42 is formed on the overall surface of the substrate 40 including the first and second semiconductor layers 41a and 41b. The photoresist layer is coated on the overall surface of the substrate and patterned to expose the second semiconductor layer 41b. Impurity ions, P or B, are implanted on the second semiconductor layer 41b using the photoresist as a mask. Here, the second semiconductor layer 41b is the lower electrode of the storage capacitor.

Figure 5B:
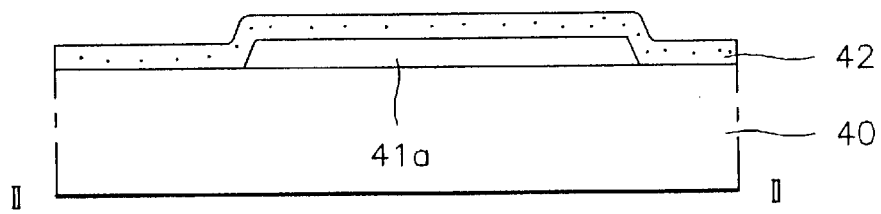
Figure 6B:
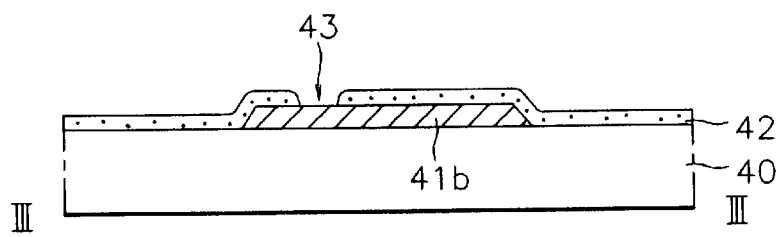
Figure 7B:
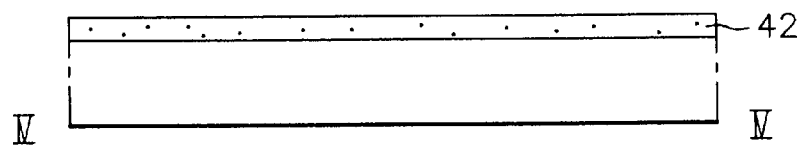

As illustrated in FIGS. 5B, 6B and 7B, the remaining photoresist is removed. The gate insulating layer 42 is selectively etched, so that a predetermined portion of the second semiconductor layer 41b is exposed to form the first contact hole 43. The first contact hole 43 is formed under the data line to be subsequently formed.

Figure 5C:
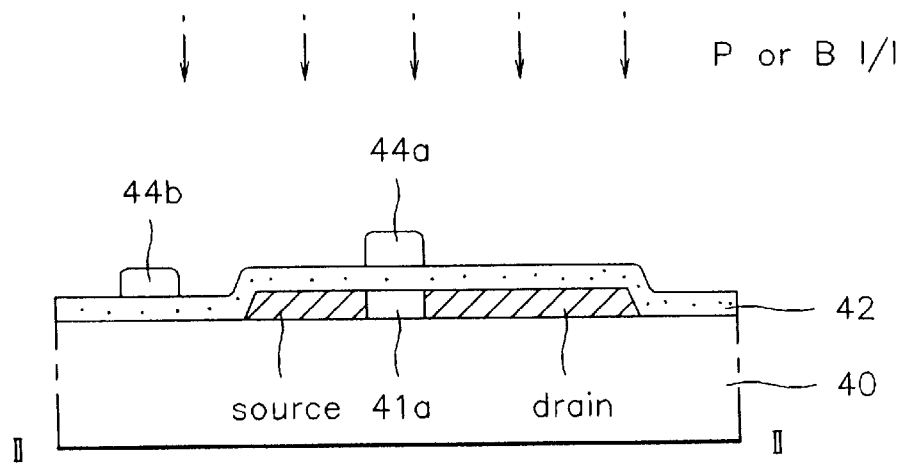
Figure 6C:
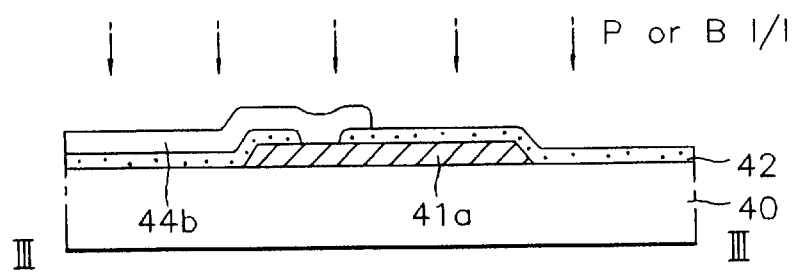
Figure 7C:
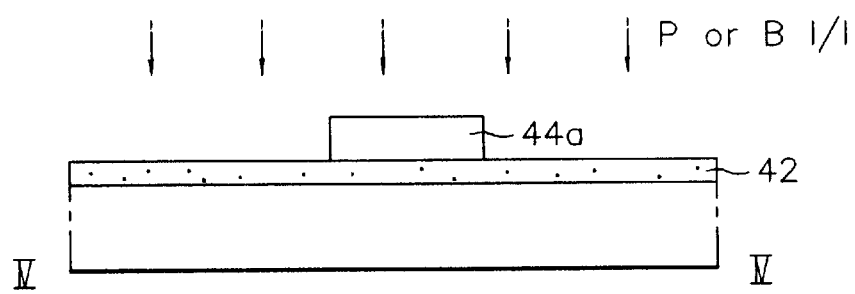
Figure 7D:
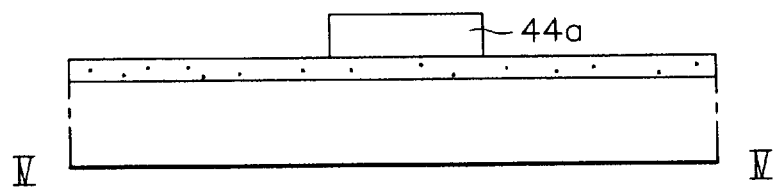

As illustrated in FIGS. 5C, 6C and 7C, a phosphorus P or boron B doped polycrystalline silicon is deposited on the gate insulating layer 42, and patterned to form the gate electrode 44a on the first semiconductor layer 41a. Simultaneously, the common electrode line 44b is formed to be connected to the second semiconductor layer 41b through the first contact hole 43. The second semiconductor layer 41b and the common electrode line serve as a lower electrode of the storage capacitor. The gate electrode 44a is formed of polycrystalline silicon to facilitate the hydrogenation process in which hydrogen radicals are entered into the first semiconductor layer 41a, e.g., the active layer, to enhance the performance of the thin film transistor (TFT). The impurity ions such as P or B are implanted in the first semiconductor layer 41a using the gate electrode 44a as a mask to form the source and drain thereon. The impurity ions are heat-treated to activate the ions, e.g., to recrystallize the polysilicon which may have been damaged during the ion implantation.

Figure 5D:
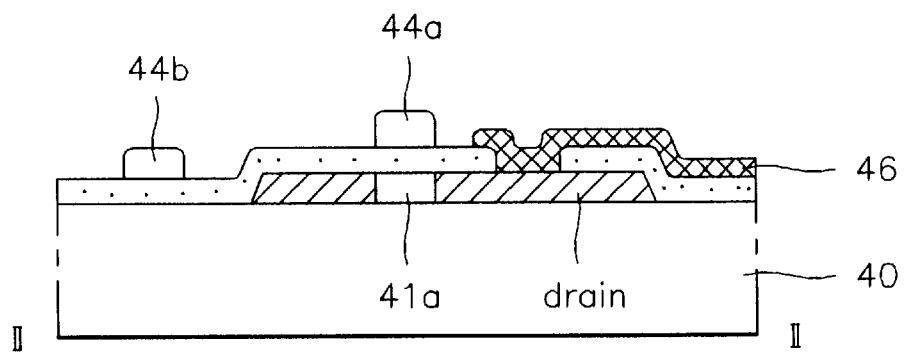
Figure 6D:
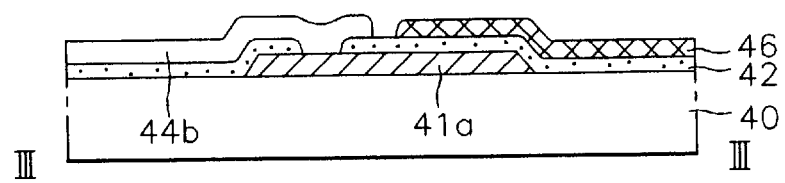

As illustrated in FIGS. 5D and 6D, the gate insulating layer 42 is selectively removed so that the second contact hole is formed to expose the drain of the first semiconductor layer 41a. A transparent layer made of a material such as ITO is deposited on the overall surface of the substrate 40 including the second contact hole. The transparent layer is patterned to connect the drain of the first semiconductor layer 41a through the second contact hole to thereby form the pixel electrode 46 on the pixel area. The pixel electrode 46 also serves as an upper electrode of the storage capacitor.

Figure 5E:
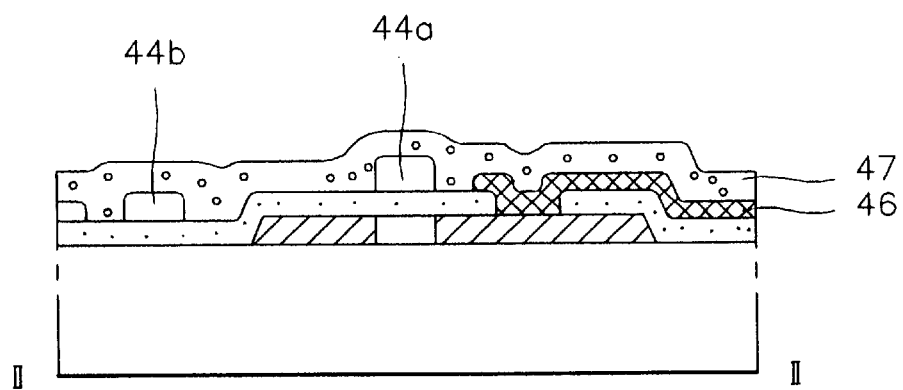
Figure 6E:
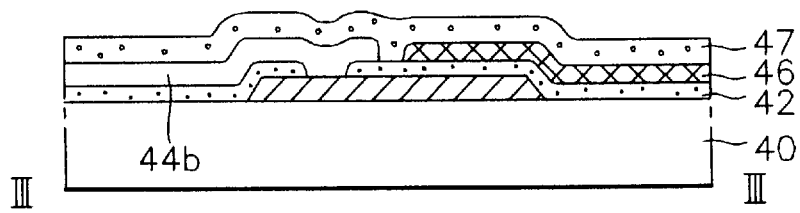
Figure 7E:
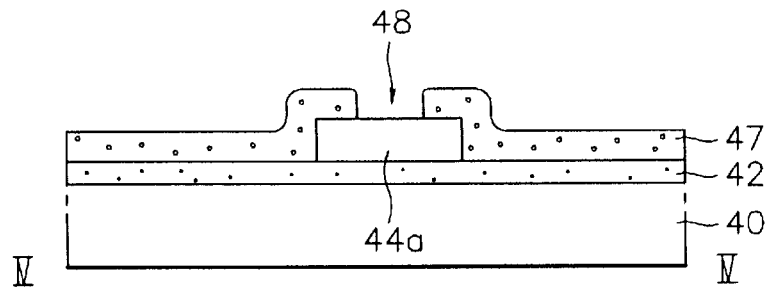

As illustrated in FIGS. 5E, 6E and 7E, the first interlayer insulating layer 47 is formed on the overall surface of the substrate 40 including the pixel electrode. The interlayer insulating layer 47 is selectively removed, exposing the gate electrode 44a so that the third contact hole 48 is formed.

Figure 5F:
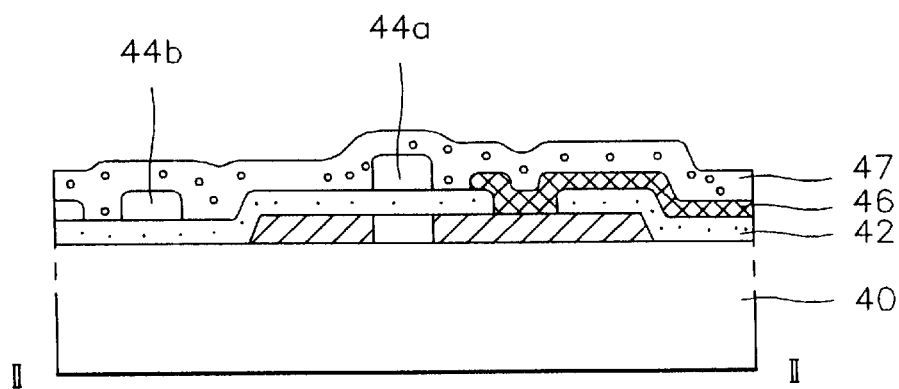
Figure 6F:
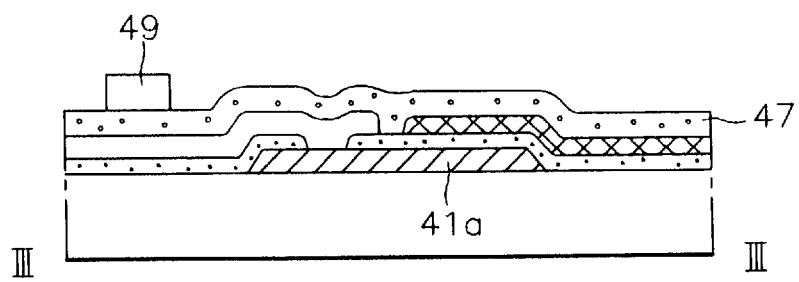
Figure 7F:
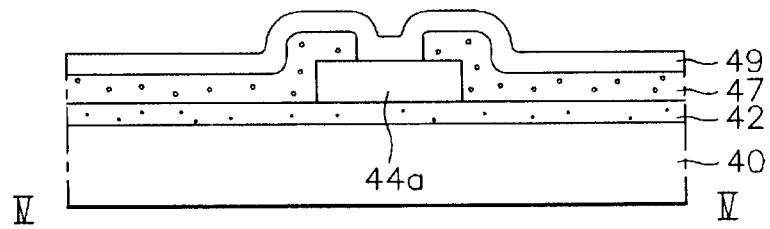

As illustrated in FIGS. 5F, 6F and 7F, a metallic layer is deposited on the overall surface of the substrate 40 including the third contact hole 48 and patterned so that the gate line 49 is connected to the gate electrode 44a through the third contact hole 48. The gate line 49 is made of one of the general metallic materials such as Al, Al(1–2% Si), and Cr. Further, the gate line 49 can be formed of the same material as the data line 52.

Figure 5G:
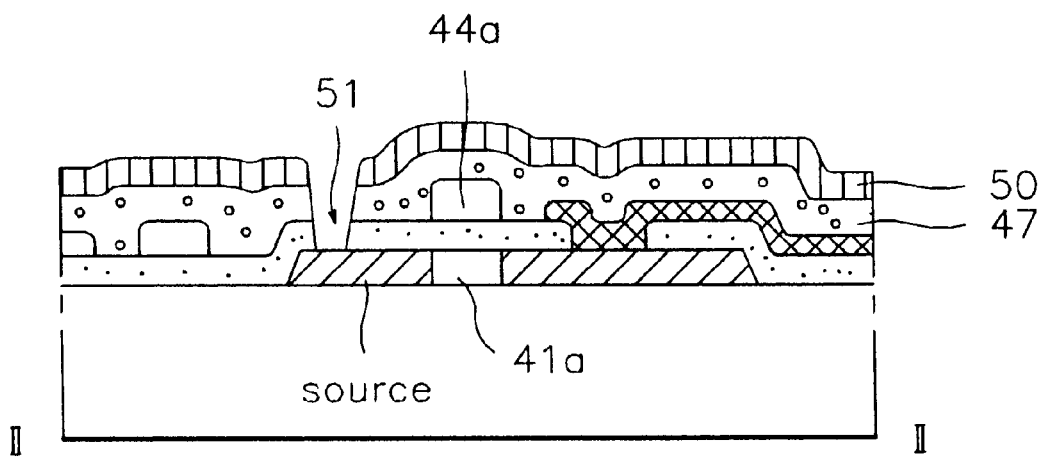
Figure 6G:
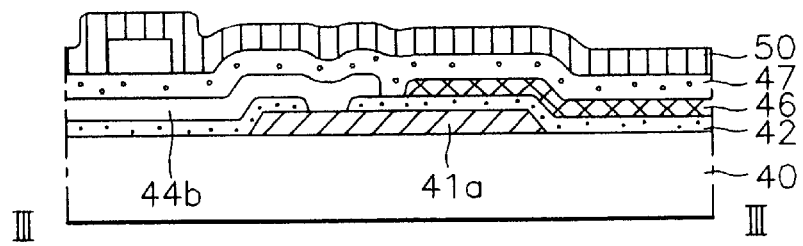
Figure 7G:
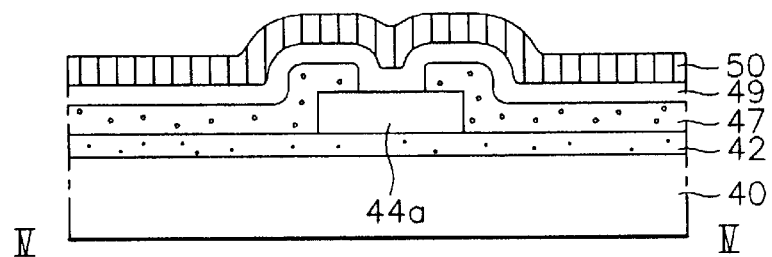

As illustrated in FIGS. 5G, 6G and 7G, the second interlayer insulating layer 50 is formed on the overall surface of the substrate 40 including the gate line 49. The gate insulating layer 42, the first interlayer insulating layer 47 and the second interlayer insulating layer 50 are selectively etched to expose the source of the first semiconductor layer 41a, thereby forming the fourth contact hole 51.

Figure 5H:
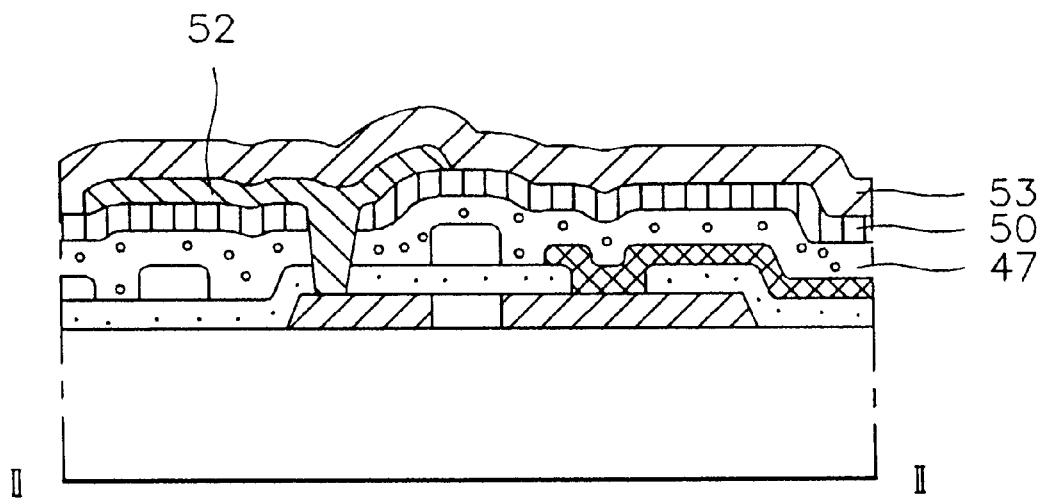
Figure 6H:
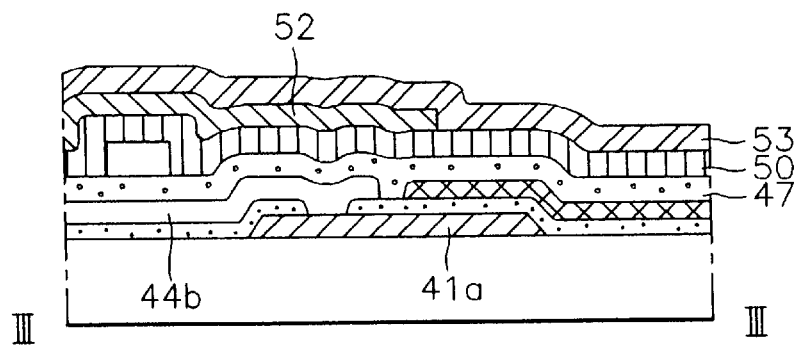
Figure 7H:
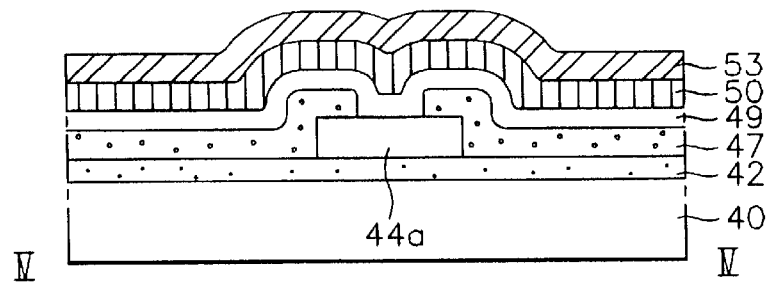

As illustrated in FIGS. 5H, 6H and 7H, a metallic layer is deposited on the overall surface of the substrate 40 including the fourth contact hole 51 and patterned to form the data line 52, which is connected to the source of the first semiconductor layer 41a through the fourth contact hole 51. The passivation layer 53 is formed on the overall surface of the substrate 40 including the data line 52, so that the lower substrate of the LCD device is completed.

The LCD device and its fabrication method of the preferred embodiment of the invention have various advantages. As the semiconductor layer, the gate insulating layer, and the transparent pixel electrode are sequentially deposited to form the storage capacitor, the area of the interlayer of the LCD device is increased. As the light is transmitted to the storage capacitor area, its interlayer is increased by the size of the storage capacitor, namely, by 20–30% of the pixel area.

Since the gate electrode of the TFT is formed using the polycrystalline silicon having a large quantity of impurity ions and the gate line utilizes a general metallic material, its gate resistance is drastically decreased to fabricate a LCD device of high image quality. Since the gate electrode of TFT is formed of the polycrystalline silicon, the hydrogen radicals are perpendicularly diffused through the gate electrode to facilitate the hydrogenation process, so that the invention enables the fabrication of the device with good performance.

It will be apparent to those skilled in the art that various modifications and variations can be made in the liquid crystal device and its fabrication method of the present invention without departing from the spirit or scope of the invention. Thus, it is intended that the present invention cover the modifications and variations of this invention provided they come within the scope of the appended claims and their equivalents.

What is claimed is:

1. A liquid crystal display (LCD) device having matrix type pixel areas, a plurality of gate lines and data lines perpendicularly formed between the pixel areas, the device comprising:

a substrate;

a first semiconductor layer formed on each pixel area of the substrate and having a source area and a drain area;

a second semiconductor layer formed on each pixel area of the substrate and used for a storage capacitor electrode;

a gate electrode formed between the source and drain of the first semiconductor layer and making contact with each gate line;

a common electrode line formed under each data line to make contact with the second semiconductor layer; and a pixel electrode formed in each pixel area, making contact with the drain area of the first semiconductor layer.

2. The LCD device of claim 1, wherein each gate line is formed of the same material as the data lines.

3. The LCD device of claim 1, wherein said first and second semiconductor layers are separated from and parallel to each other.

4. The LCD device of claim 1, wherein the gate lines and the gate electrode are formed of different materials from each other.

5. The LCD device of claim 1, wherein the common electrode line overlaps with the data lines.

6. The LCD device of claim 1, wherein the gate electrode and the common electrode lines are formed of polycrystalline silicon having impurity ions.

7. The LCD device of claim 1, wherein the gate line is formed of a metallic material.

8. The LCD device of claim 7, wherein said metallic material is one of Al, Al(1–2% Si) and Cr.

9. The LCD device of claim 1, wherein the data line is formed in parallel with the common electrode line.

10. A semiconductor device comprising:

a substrate;

a plurality of common electrode lines;

a plurality of gate electrode lines and data electrode lines to define at least one pixel area, said plurality of data electrode lines being formed in parallel with said plurality of common electrode lines and each pixel area having;

a transistor on the pixel area of said substrate, said transistor having a source electrode connected to a corresponding data electrode line, a drain electrode and a gate electrode connected to a corresponding gate electrode line, a capacitor, separated from said transistor, formed on the pixel area, said capacitor being connected to a corresponding gate electrode line, and a pixel electrode formed on the pixel area of said substrate, said pixel electrode being connected to the drain electrode of said transistor.

11. The semiconductor device of claim 10, wherein said capacitor is formed on said substrate substantially parallel with said transistor.

12. The semiconductor device of claim 10, wherein said common electrode lines are formed insulatively beneath said data electrode lines.

13. The semiconductor device of claim 10, wherein said common and data electrode lines are made of a same material.

14. The semiconductor device of claim 10, wherein said common and data electrode lines are made of different materials.

15. The semiconductor device of claim 10, wherein said transistor is a thin film transistor formed on said substrate, said substrate being made of one of glass and quartz.

16. In a liquid crystal display device having a plurality of first and second signal lines forming a matrix of pixel areas on a substrate, each pixel area having a transistor, a storage capacitor, a common electrode line and a pixel electrode, the capacitor comprising:

a semiconductor layer formed on each pixel area of the substrate, said semiconductor layer of the capacitor being a separate layer from a semiconductor layer of the transistor, the common electrode line being connected to said semiconductor layer of the capacitor and the pixel electrode insulatively overlapping said semiconductor layer of the capacitor, wherein the common electrode line is formed beneath and parallel with a corresponding first signal line.

17. The capacitor of claim 16, wherein the first and second signal lines are data and gate lines.

* * * * *